(12) United States Patent
Boerstler et al.

(10) Patent No.: US 7,187,053 B2
(45) Date of Patent: Mar. 6, 2007

(54) THERMAL SENSING METHOD AND SYSTEM

(75) Inventors: David William Boerstler, Round Rock, TX (US); Munehiro Yoshida, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 10/606,586

(22) Filed: Jun. 26, 2003

(65) Prior Publication Data

US 2004/0264093 A1    Dec. 30, 2004

(51) Int. Cl.
*H01L 31/058*    (2006.01)
(52) U.S. Cl. ...................... 257/467; 257/470
(58) Field of Classification Search ............... 257/414, 257/467–470, 108, 252; 438/48, 49, 54, 438/55

See application file for complete search history.

(56) References Cited

U.S. PATENT DOCUMENTS

| 5,159,520 | A | * | 10/1992 | Toyooka et al. | 361/103 |
| 5,805,403 | A | * | 9/1998 | Chemla | 361/103 |
| 6,144,085 | A | * | 11/2000 | Barker | 257/467 |
| 6,337,246 | B1 | * | 1/2002 | Sobek et al. | 438/264 |
| 6,361,207 | B1 | * | 3/2002 | Ferguson | 374/185 |
| 6,381,286 | B1 | * | 4/2002 | Wilkinson et al. | 375/296 |

* cited by examiner

*Primary Examiner*—Thien F. Tran
(74) *Attorney, Agent, or Firm*—Carr LLP; Diana R. Gerhardt

(57) ABSTRACT

The present invention provides an integrated circuit. The integrated circuit has a plurality of chip areas. The integrated circuit also has a plurality of temperature sensors, at least one per chip area. The temperature sensors generate a voltage proportional to the measured temperature. A voltage comparator compares the voltage output of the plurality of temperature sensors. The voltage comparator is further employable to generate a signal if the difference between the voltages generated by the plurality of temperature sensors exceeds a threshold.

16 Claims, 2 Drawing Sheets

THERMAL SENSING METHOD AND SYSTEM

TECHNICAL FIELD

The invention relates generally to thermal sensing and, more particularly, to thermal sensing in an integrated circuit.

BACKGROUND

A complementary metal-oxide semiconductor (CMOS) is one type of transistor used in an integrated circuit (IC). CMOS transistors generate heat when switching from an off state to an on state, or from an on state to an off state, within the IC. If this heat is neither properly dissipated nor otherwise accounted or compensated, the CMOS transistor can experience degeneration leading to CMOS transistor failure.

Silicon on insulator (SOI) technology can be employed in CMOS fabrication. Generally, SOI is a manufacturing technique in which devices are fabricated on top of a relatively thick layer of silicon dioxide ($SiO_2$), thereby reducing the capacitances of the individual CMOS transistors. The reduction of capacitances of the CMOS transistors can result in significant processing gains in terms of speed of processing.

However, although the IC can have an associated temperature sensor, there can be significant variation in the readings obtained from the temperature sensor from IC to IC. Therefore, a calibration of the temperature sensor is performed to compensate for this variation. Calibration of temperature sensors can be time intensive and costly. Furthermore, the measurement of heat by the temperature sensors in ICs, such as an IC manufactured using the silicon on insulator (SOI) approach, has proven problematic, due to such factors as thermal isolation of CMOS transistors in the chip.

Therefore, what is needed is an IC chip that measures temperature that solves at least some of the disadvantages of conventional ICs that measure temperature.

SUMMARY OF THE INVENTION

The present invention provides an integrated circuit. The integrated circuit has a plurality of chip areas. The integrated circuit also has a plurality of temperature sensors. At least two temperature sensors individually correlate to at least two chip areas. A comparator compares the output of the plurality of temperature sensors. The comparator is further employable to generate a signal if the difference between the plurality of temperature sensors exceeds a threshold.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
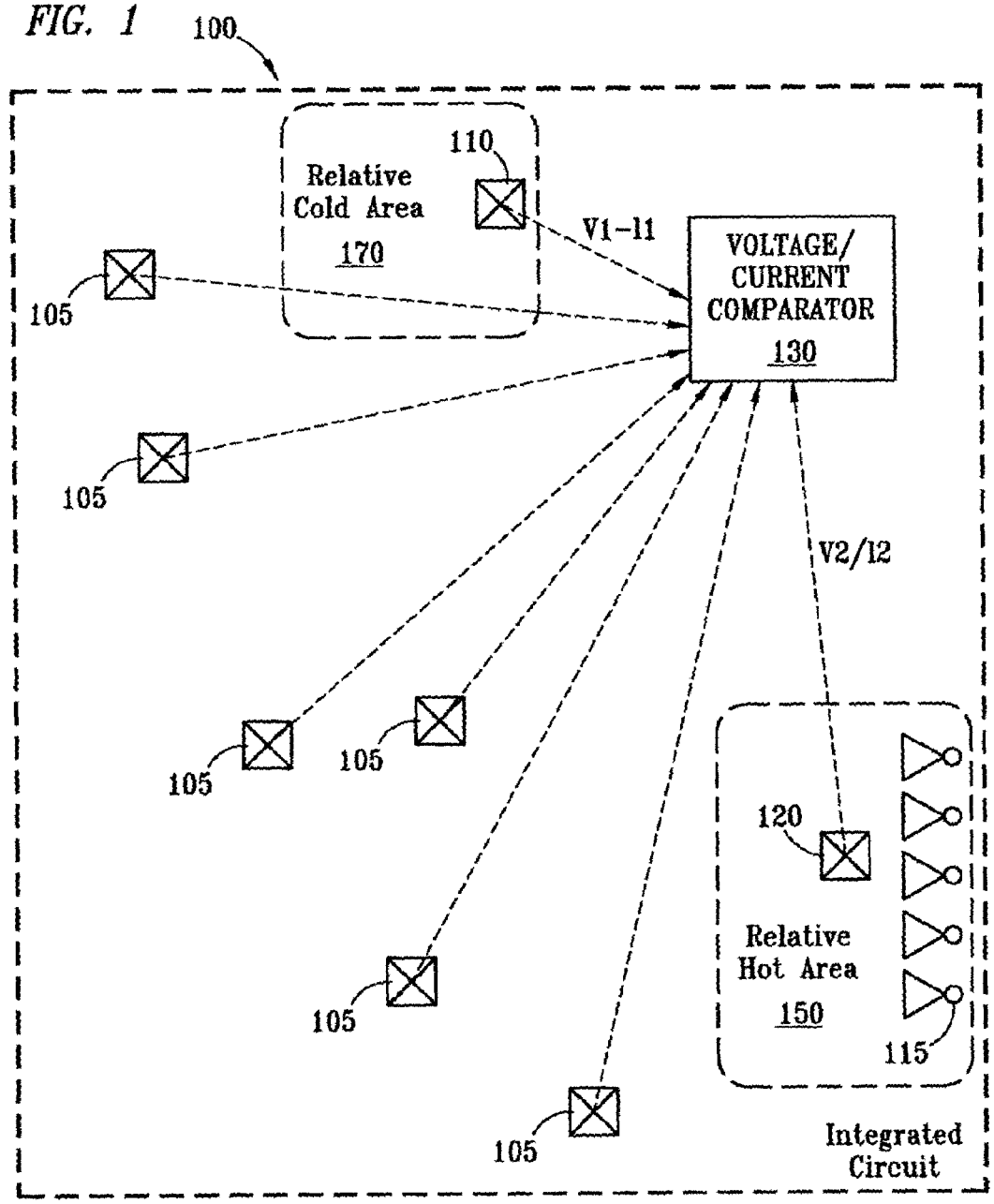
FIG. 1 schematically depicts an IC having a plurality of temperature sensors distributed in a plurality of areas of the IC.

Turning to FIG. 1, disclosed is an IC 100. The IC 100 has a plurality of temperature sensors 105. Each temperature sensor 105 is coupled to or embedded within its own area of the IC 100. The IC 100 further has a relative hot area 150 and a relative cold area 170. Generally, the heat generated in the areas 150 and 170 can be proportional to the use of devices within that area, and the type of devices in those areas. For instance, in FIG. 1, the hot area 150 has a plurality of input/output (IO) devices 115. In one embodiment, the IO devices 115 are used more extensively than devices in the cold area 170. Therefore, more heat is generated in the hot area 150.

The IC 100 comprises the first temperature sensor 110 in the cold area 170 and the second temperature sensor 120 in the hot area 150. Generally, the temperature sensors 105, 110 and 120 generate a voltage that is proportional to the measured temperature. The first temperature sensor 110 generates a voltage V1, and the second temperature sensor generates a voltage V2. The temperature sensors 105 can be manufactured with pn junctions, thermal resistors, a voltage producing metal, a well implant, and so on. However, in another embodiment, the temperature sensors 105, 110 and 120 generate a current that is proportional to the measured temperature.

These voltages are input into a voltage comparator 130. Alternatively, these currents are input into a current comparator 130. Although not illustrated for ease of description, the temperature sensors 105 also generate their own voltages or currents as a function of temperature, and these voltages are also input into the voltage comparator 130 for differential temperature comparison.

The voltage comparator 130 determines the difference between the various voltages V1, V2 and so on. If the difference is below a given threshold, the corresponding temperature difference between the hot area 150 and the cold area 170, or other voltage comparisons of interest, does not indicate an error condition. However, if the voltage difference is above a given threshold, an error condition is indicated in an indicator signal generated by the voltage comparator 130. The current comparator 130 can determine the difference between the various currents output by the sensors, and employ this difference in a similar manner to the difference measured by the voltage comparator 130.

"Relative" temperatures are employed in determining if an error condition in the IC 100 is indicated. Relative temperatures can generally be defined as the difference in temperature from one area of the IC 100 compared to another area of the IC 100. Relative temperature sensing can reduce or eliminate some process variation problems from temperature sensor to temperature sensor. The relative sensitivity of temperature sensors within the same IC typically vary less than the relative sensitivity of temperature sensors between two separate ICs. Therefore, employing a plurality of temperature sensors in the same IC 100, one temperature sensor measured to another temperature sensor, can be less manufacturing process intensive than calibrating each temperature sensor to a standard temperature.

In one embodiment, an absolute temperature sensor for the chip is not employed to determine an error condition. In other words, the relative temperature differences, as measured by the temperature sensors 105, 110, and 120 and compared by the voltage comparator 130 are employed to determine error conditions within the IC 100. However, no temperature that is not compared to another temperature is employed by the voltage comparator 130.

Relative temperature differences between the hot area 150 and the cold area 170 are determined by the voltage comparator 130. A relative temperature difference that exceeds a certain threshold can indicate an error condition. The occurrence of hot areas and cold areas in an IC can be especially pronounced in SOI ICs, due to the high thermal resistance of the buried oxide. In an SOI circuit, there can be substantial thermal isolation between devices in close proximity to one another. Therefore, relative "hot spots" in the IC chip can develop due to the uneven utilization of CMOS and other devices distributed throughout the IC. The hot spot or hot spots are monitored by one or more temperature sensors 120 and compared with the temperature measured by temperature sensors 110 to determine if an error is indicated.

In a further embodiment, the temperature sensors 105 have differing temperature versus voltage or current characteristics. For instance, the voltage or current generated at a given temperature can differ from one temperature sensor 105 to another temperature sensor 105, the increase in voltage generated for a given increase in temperature can differ, and so on. The voltage comparator 130 is employable to compensate for the various temperature to voltage conversion of the temperature sensors 105, and to employ the compensated readings to determine whether the voltage differential exceeds a threshold.

Figure 2:
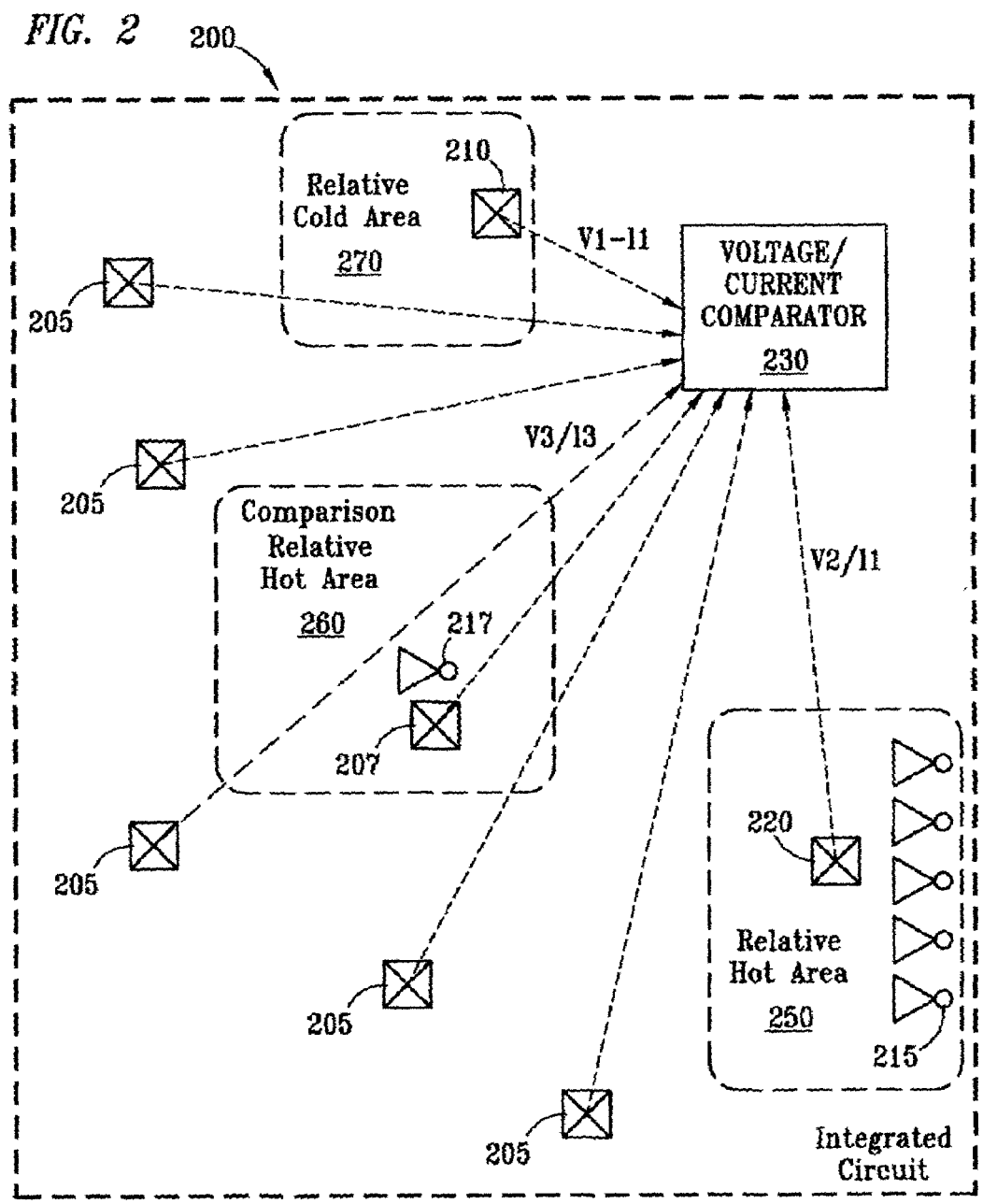
FIG. 2 schematically depicts an IC chip having a plurality of temperature sensors distributed in a plurality of areas of the IC, and a third sensor is a simulated "hot spot" area of the IC.

Turning now to FIG. 2, disclosed is an IC 200. The IC 200 has a plurality of temperature sensors 205. Each temperature sensor 205 is coupled to or embedded within its own area of the IC 200. The IC 200 further has a relative hot area 250 and a relative cold area 270. The IC 200 still further has a comparison relative hot area 260. The comparison relative hot area 260 comprises a comparison I/O device 217 and a temperature sensor 207. Generally, the comparison I/O device 217 simulates the activity of I/O devices 215, thereby generating comparable heat characteristics.

The IC 200 further comprises a first temperature sensor 210 in the cold area 270, a second temperature sensor 220 in the hot area 250 and a third temperature sensor 207 in the hot comparison area 260. The first temperature sensor 210 generates a voltage V1, the second temperature sensor generates a voltage V2, and the third temperature sensor 207 generates a voltage V3. These voltages are input into a voltage comparator 230. Alternatively, the first temperature sensor 210 generates a first current I1, the second temperature sensor generates a second current I2, and the third temperature sensor 207 generates a third current I3. These are input into a current comparator 230.

The voltage comparator 230 determines the difference between the various voltages V1 and V2. Similarly, the current comparator 230 determines the difference between the first and second current. If the difference is below a given threshold, the corresponding temperature difference between the hot area 250 and the cold area 270 does not indicate an error condition. However, if the difference is above a given threshold, an error condition is indicated in an indicator signal.

Furthermore, the voltage comparator 230 compares the difference between the voltages V2 and V3 or the current comparator 230 compares the difference between the second current and the third current. Because the comparison relative hot area 260 has a similar temperature as the relative hot area 250, the measurements generated by the temperature sensors 207 and 220 are similar. However, if the temperature sensors 207 and 220 diverge in their measurements as determined by the voltage comparator 230, an error condition is indicated. The error condition can be a faulty temperature sensor 207, 220. The error can also be in the I/O circuits 215. In any event, the voltage or current comparator 230 can generate a "too hot" or "too cold" signal, which can be employed by some other part of the IC chip or the operating system running in the IC chip.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. An integrated circuit (IC) chip, comprising:
a plurality of chip areas on the same chip, wherein at least one chip area is a comparison chip area and wherein the at least one comparison chip area further comprises at least one input/output ("I/O") device that is controlled to simulate other functional I/O devices on the same chip;
a plurality of temperature sensors, at least one temperature sensor per chip area; and
a comparator for comparing the output of any one of the plurality of temperature sensors with the output of any other of the plurality of temperature sensors, the comparator further employable to generate a signal if the difference between the outputs of the plurality of temperature sensors exceeds a threshold.

2. The integrated circuit of claim 1, wherein the temperature sensor measures a temperature to generate a voltage.

3. The integrated circuit of claim 1, wherein the temperature sensor measures a temperature to generate a current.

4. The integrated circuit of claim 1, wherein the temperature sensor comprises a pn junction.

5. The integrated circuit of claim 1, wherein the temperature sensor comprises a thermal resistor.

6. The integrated circuit of claim 1, wherein the comparator is coupled to the chip.

7. The integrated circuit of claim 1, wherein the comparator compares voltages generated from the plurality of temperature sensors.

8. The integrated circuit of claim 1, farther comprising a layer of silicon dioxide interposed between a substrate of the integrated circuit and a computational element of the integrated circuit.

9. An integrated circuit, comprising:
- a plurality of chip areas on the same chip, at least one chip area employed as a comparison area, wherein the at least one comparison chip area further comprises at least one I/O device that is controlled to simulate other functional I/O devices on the same chip;
- a plurality of temperature sensors, at least one temperature sensor per chip area; and
- a comparator for comparing the output of any one of the plurality of temperature sensors with the temperature sensor in the comparison area.

10. The integrated circuit of claim 9, further comprising a layer of silicon dioxide interposed between a substrate of the integrated circuit and a computational element of the integrated circuit.

11. The integrated circuit of claim 9, wherein the temperature sensor measures a temperature to generate a current.

12. The integrated circuit of claim 9, wherein the temperature sensor measures a temperature to generate a voltage.

13. The integrated circuit of claim 9, wherein the temperature sensor comprises a pn junction.

14. The integrated circuit of claim 9, wherein the temperature sensor comprises a thermal resistor.

15. The integrated circuit of claim 9, wherein the comparator is coupled to the chip.

16. An integrated circuit (IC) chip, comprising:
- a plurality of chip areas on the same chip, wherein one chip area is employed as a comparison area, wherein the at least one comparison chip area further comprises at least one I/O device that is controlled to simulate other functional I/O devices on the same chip;
- a plurality of temperature sensors, at least one temperature sensor per chip area, each temperature sensor generating an output having a distinct temperature-versus-output conversion characteristic wherein the output is proportional to the measured temperature; and
- a comparator for comparing the output of any one of the plurality of temperature sensors with the output of any other of the plurality of temperature sensors, the comparator generating a signal in response to the difference between the outputs of the plurality of temperature sensors exceeding a threshold, wherein the comparator compensates for differing temperature-versus-output conversion characteristics between any two of the plurality of temperature sensors.

* * * * *